(12) United States Patent
Scheiper et al.

(10) Patent No.: US 8,318,564 B2
(45) Date of Patent: Nov. 27, 2012

(54) PERFORMANCE ENHANCEMENT IN TRANSISTORS COMPRISING HIGH-K METAL GATE STACK BY AN EARLY EXTENSION IMPLANTATION

(75) Inventors: Thilo Scheiper, Dresden (DE); Sven Beyer, Dresden (DE); Jan Hoentschel, Dresden (DE); Uwe Griebenow, Markleeberg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 78 days.

(21) Appl. No.: 12/899,676

(22) Filed: Oct. 7, 2010

(65) Prior Publication Data
US 2011/0127617 A1 Jun. 2, 2011

(30) Foreign Application Priority Data
Nov. 30, 2009 (DE) .................. 10 2009 047 313

(51) Int. Cl.
*H01L 21/336* (2006.01)
*H01L 21/8238* (2006.01)
(52) U.S. Cl. .............. 438/285; 438/231; 257/E21.409; 257/E21.632

(58) Field of Classification Search ............... None
See application file for complete search history.

(56) References Cited

U.S. PATENT DOCUMENTS

| 6,348,387 B1 * | 2/2002 | Yu ................. 438/303 |
| 2005/0082605 A1 * | 4/2005 | Akasaka ............ 257/329 |
| 2005/0095796 A1 | 5/2005 | van Bentum et al. ...... 438/300 |
| 2007/0048919 A1 * | 3/2007 | Adetutu et al. ........... 438/199 |

OTHER PUBLICATIONS

Translation of Official Communication from German Patent Office for German Patent Application No. 10 2009 047 313.0 dated Feb. 4, 2011.

* cited by examiner

*Primary Examiner* — Seahvosh Nikmanesh
(74) *Attorney, Agent, or Firm* — Williams, Morgan & Amerson, P.C.

(57) ABSTRACT

In sophisticated transistor elements, integrity of sensitive gate materials may be enhanced while, at the same time, the lateral offset of extension regions may be reduced. To this end, at least a portion of the extension regions may be implanted at an early manufacturing stage, i.e., in the presence of a protective liner material, which may, after forming the extension regions, be patterned into a protective spacer structure used for preserving integrity of the sensitive gate electrode structure.

17 Claims, 6 Drawing Sheets

PERFORMANCE ENHANCEMENT IN TRANSISTORS COMPRISING HIGH-K METAL GATE STACK BY AN EARLY EXTENSION IMPLANTATION

BACKGROUND OF THE INVENTION

1. Field of the Invention

Generally, the present disclosure relates to the fabrication of integrated circuits, and, more particularly, to P-channel transistors comprising a high-k metal gate electrode formed in an early manufacturing stage.

2. Description of the Related Art

The fabrication of complex integrated circuits requires the provision of a large number of transistor elements, which represent the dominant circuit element in complex integrated circuits. For example, several hundred millions of transistors may be provided in presently available complex integrated circuits. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies, such as CPUs, storage chips and the like. During the fabrication of complex integrated circuits using CMOS technology, millions of transistors, i.e., N-channel transistors and P-channel transistors, are formed on a substrate including a crystalline semiconductor layer. A MOS transistor, or generally a field effect transistor, irrespective of whether an N-channel transistor or a P-channel transistor is considered, comprises so-called PN junctions that are formed by an interface of highly doped drain and source regions and an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions to provide low sheet and contact resistivity, in combination with a desired channel controllability.

With a reduced channel length, generally, a shallow dopant profile may be required in the drain and source regions, while, nevertheless, a moderately high dopant concentration is required in view of providing a low series resistance, which in turn results in a desired drive current in combination with a reduced transistor channel. A shallow dopant profile in combination with a low overall drain and source resistance is typically realized by forming so-called drain and source extension regions, which may represent extremely shallow doped areas extending below the gate electrode structure so as to appropriately connect to the channel region. On the other hand, an increased lateral offset from the channel region is adjusted on the basis of appropriately dimensioned sidewall spacers, which are used as implantation masks for forming the actual drain and source regions with a desired high dopant concentration and with an increased depth compared to the drain and source extension regions. By appropriately selecting the size of the drain and source extension regions, channel controllability may be maintained for very short channel transistors while also providing a desired low overall series resistance in connecting the drain and source regions to the channel region. Consequently, for a desired performance of sophisticated transistor elements, a certain degree of overlap of the drain and source extension regions with the gate electrode is desirable in order to obtain a low threshold voltage and a high current drive capability. The overlap of the drain and source extension regions with the gate electrode gives rise to a specific capacitive coupling that is also referred to as Miller capacitance. Typically, a desired Miller capacitance is adjusted on the basis of implantation processes in which the drain and source dopants may be introduced in order to form the basic configuration of the drain and source extension regions, wherein the final shape of these regions may then be adjusted on the basis of a sequence of anneal processes in which implantation-induced damages are re-crystallized and also a certain degree of dopant diffusion may occur, thereby finally determining the resulting Miller capacitance.

Upon continuously reducing the channel length of field effect transistors, generally, an increased degree of capacitive coupling is required in order to maintain controllability of the channel region, which may typically require an adaptation of a thickness and/or material composition of the gate dielectric material. For example, for a gate length of approximately 80 nm, a gate dielectric material based on silicon dioxide with a thickness of less than 2 nm may be required in high speed transistor elements, which may, however, result in increased leakage currents caused by hot carrier injection and direct tunneling of charge carriers through the extremely thin gate dielectric material. Since a further reduction in thickness of silicon dioxide-based gate dielectric materials may become increasingly incompatible with thermal power requirements of sophisticated integrated circuits, other alternatives have been developed in increasing the charge carrier mobility in the channel region, thereby also enhancing overall performance of field effect transistors. One promising approach in this respect is the generation of a certain type of strain in the channel region, since the charge carrier mobility in silicon strongly depends on the strain conditions of the crystalline material. For example, for a standard crystallographic configuration of the silicon-based channel region, a compressive strain component in a P-channel transistor may result in a superior mobility of holes, thereby increasing switching speed and drive current of P-channel transistors. The desired compressive strain component may be obtained according to well-established approaches by incorporating a strain-inducing semiconductor material, for instance in the form of a silicon/germanium mixture or alloy, in the active region of the P-channel transistor. For example, after forming the gate electrode structure, corresponding cavities may be formed laterally adjacent to the gate electrode structure in the active region and may be refilled with the silicon/germanium alloy which, when grown on the silicon material, may have an internal strained state, which in turn may induce a corresponding compressive strain component in the adjacent channel region. Consequently, a plurality of process strategies have been developed in the past in order to incorporate a highly strained silicon/germanium material in the drain and source areas of P-channel transistors, which may, however, also require corresponding adaptations in view of obtaining a desired lateral and vertical dopant profile for the drain and source regions and the corresponding extension regions as, for instance, boron, which is frequently used as a P-type dopant species, may have a significantly different diffusion behavior in a silicon/germanium material compared to a silicon-based material. That is, in a silicon/germanium material having a germanium concentration of approximately 20 atomic percent or higher, the diffusivity of the boron species is significantly less compared to a silicon, which may have to be taken into consideration when adjusting the overall transistor characteristics. For example, typically, the drain and source extension regions may be formed so as to be located within a silicon material so that the Miller capacitance may be adjusted on the basis of the diffusion characteristics in silicon material to obtain the required overlap of the drain and source extension regions with the gate electrode structure without having to take into consideration the reduced diffusivity in a silicon/germanium material.

During the continuous reduction of the critical dimensions of transistors, an appropriate adaptation of the material composition of the gate dielectric material has been proposed such that, for a physically appropriate thickness of a gate dielectric material, i.e., for reducing the gate leakage currents, nevertheless, a desired high capacitive coupling may be achieved. Thus, material systems have been developed which have a significantly higher dielectric constant compared to the conventionally used silicon dioxide-based materials, silicon oxynitride materials and the like. For example, materials including hathium, zirconium, aluminum and the like may have a significantly higher dielectric constant and are, therefore, referred to as high-k dielectric materials, which are to be understood as materials having a dielectric constant of 10.0 or higher when measured in accordance with typical measurement techniques. As is well known, the electronic characteristics of the transistor elements also strongly depend on the work function of the gate electrode material which influences the band structure of the semiconductor material in the channel region separated from the gate electrode material by the gate dielectric material. In well-established polysilicon/silicon dioxide-based gate electrode structures, the corresponding threshold voltage, strongly influenced by the gate dielectric material and the adjacent electrode material, is adjusted by appropriately doping the polysilicon material in order to appropriately adjust the work function of the polysilicon material at the interface between the gate dielectric material and the electrode material. Similarly, in gate electrode structures including a high-k gate dielectric material, the work function has to be appropriately adjusted for N-channel transistors and P-channel transistors, respectively, which may require appropriately selected work function adjusting metal species, such as lanthanum for N-channel transistors and aluminum for P-channel transistors. For this reason, corresponding metal-containing conductive materials may be positioned close to the high-k gate dielectric material in order to form an appropriately designed interface that results in the target work function of the gate electrode structure. In many conventional approaches, the work function adjustment may be performed at a very late manufacturing stage, i.e., after any high temperature processes, which may require the replacement of a placeholder material of the gate electrode structures, such as polysilicon, and the incorporation of appropriate work function adjusting species in combination with an electrode metal, such as aluminum and the like. In this case, however, very complex patterning and deposition process sequences may be required on the basis of gate electrode structures having critical dimensions of 50 nm and significantly less, which may result in severe variations of the resulting transistor characteristics.

Therefore, other process strategies have been proposed in which the work function adjusting materials may be applied in an early manufacturing stage, i.e., upon forming the gate electrode structures, wherein the corresponding metal species may be thermally stabilized and encapsulated in order to obtain the desired work function and thus threshold voltage of the transistors without being unduly influenced by the further processing. For this purpose, it turns out that, for P-channel transistors, an appropriate adaptation of the band gap of the channel semiconductor material may be required in order to appropriately set the work function of the P-channel transistors. For this reason, frequently, a so-called threshold adjusting semiconductor material, for instance in the form of a silicon/germanium mixture, may be formed on the active regions of the P-channel transistors prior to forming the gate electrode structures, thereby obtaining the desired offset in the band gap of the channel semiconductor material. Although this concept is a promising approach for forming sophisticated high-k metal gate electrode structures in an early manufacturing stage, the adjustment of the transistor characteristics may be difficult to achieve on the basis of conventional strategies, as will be described in more detail with reference to FIGS. 1a-1d.

FIG. 1a schematically illustrates a cross-sectional view of a semiconductor device 100 comprising a substrate 101 and a silicon-based semiconductor layer 102. The semiconductor layer 102 comprises a plurality of "active" regions, such as semiconductor regions 102A, 102B, which are laterally delineated by an isolation structure (not shown), that may, for instance, by provided in the form of a shallow trench isolation. It should be appreciated that an active region, such as the semiconductor regions 102A, 102B, is to be understood as a semiconductor region in and above which one or more transistors are to be formed. For example, the active region 102A may be used for forming a transistor 150A, which, in the example shown, represents a P-channel transistor. Similarly, a transistor 150B is to be formed in and above the active region 102B and represents an N-channel transistor. Consequently, the basic doping in the active regions 102A, 102B is appropriately adapted to the different conductivity types of the transistors 150A, 150B. Furthermore, in the manufacturing stage shown, the transistor 150A comprises a gate electrode structure 160A, which may also be referred to as a high-k metal gate electrode structure, since it may comprise a gate dielectric material 161 having incorporated therein any high-k type material, for instance based on hafnium oxide, zirconium oxide and the like. It should be appreciated that the gate dielectric material 161 may further comprise a "conventional" dielectric material, such as silicon oxynitride and the like, so as to provide a superior interface characteristic, if required. Furthermore, the gate electrode structure 160A comprises a metal-containing material layer 162A, which may also have incorporated therein an appropriate metal species for adjusting the work function of the gate electrode structure 160A, as explained above. For this purpose, an aluminum species may be incorporated into the material 162A, which may basically be comprised of a titanium nitride material and the like. In other approaches, the work function species may be incorporated in the gate dielectric material 161, while the layer 162A may represent an appropriate electrode material, such as titanium nitride. Furthermore, a semiconductor-based electrode material 163, such as an amorphous silicon material, a polycrystalline silicon material and the like, is formed above the material 162A. Finally, the gate electrode structure 160A comprises a dielectric cap layer 164, such as a silicon nitride material and the like. As previously explained, in sophisticated semiconductor devices, a gate length, i.e., in FIG. 1a, the horizontal extension of the gate electrode structure 160A, may be 40 nm and less. Similarly, the transistor 150B comprises a gate electrode structure 160B, which may have a similar configuration as the gate electrode structure 160A in view of the gate dielectric material 161, the electrode material 163 and the cap layer 164. On the other hand, a conductive cap material 162B and/or the gate dielectric material 161 may have incorporated therein an appropriate work function metal species, such as a lanthanum species, in order to obtain a desired work function so as to adjust an appropriate threshold voltage for the transistor 150B.

As previously explained, it may be necessary to generate an appropriate band gap offset of the semiconductor material in the channel region 152 of one of the transistors 150A, 150B, which may be accomplished by providing an appropriately adapted semiconductor material, such as a silicon/germanium alloy 152A in the transistor 150A. Consequently, by appropriately selecting a thickness and a germanium concentration of the layer 152A, a desired bending of the band structure of the channel region 152 with respect to the gate electrode structure 160A may be achieved.

Furthermore, in the manufacturing stage shown, the sidewalls of the gate electrode structure 160A are masked by a protective spacer 103, such as a silicon nitride material, in combination with an oxide spacer material 104 and a further spacer element 105S, wherein these spacer elements may substantially define the lateral offset of a strain-inducing semiconductor material 151, such as a silicon/germanium material, from the channel region 152. As discussed above, the strain-inducing material 151 may enhance performance of the transistor 150A by inducing, for instance, a compressive strain component in the channel region 152. On the other hand, the gate electrode structure 160B and the active region 102B are covered by a spacer layer 105, while the spacer elements 103 and 104 are also formed on sidewalls of the gate electrode structure 160B.

The semiconductor device 100 as illustrated in FIG. 1a may be formed on the basis of well-established process techniques for providing the active regions 102A, 102B by forming isolation structures and incorporating a desired well dopant species. Thereafter, the dielectric material 161 in combination with the materials 162A, 162B are provided, wherein appropriate patterning regimes may be applied so as to selectively provide the material 162A above the active region 102A and the material 162B above the active region 102B. In other process strategies, one of the materials 162A, 162B may also be provided in the other gate electrode structure, however, embedded in a diffusion blocking material so as to substantially not influence the work function of the gate electrode structure under consideration. Prior to or after providing the electrode material 163, additional heat treatments may be performed so as to diffuse the corresponding work function metal species into the layers 162A and 162B, respectively, and also towards the gate dielectric material 161. Furthermore, during the corresponding heat treatment, a thermal stabilization may be achieved, thereby reducing any effect of further heat treatment to be performed in later manufacturing stages.

In still other approaches, the work function adjusting species may be provided as material layers and may be diffused into the dielectric material 161, followed by the removal of these material layers and the deposition of the layers 162A, 162B, which may then have the same configuration in the gate electrode structures 160A, 160B.

Next, the resulting gate layer stack is patterned on the basis of sophisticated lithography and etch techniques, thereby obtaining the gate electrode structures 160A, 160B as shown in FIG. 1a. Consequently, the work function and thus the threshold voltages of the transistors 150A, 150B may be determined in an early manufacturing stage, thereby, however, requiring a reliable confinement of, in particular, the sensitive materials 161, 162A and 162B. For this purpose, a silicon nitride liner material is deposited, for instance, on the basis of highly conformal and uniform thermally activated and/or plasma activated chemical vapor deposition (CVD) techniques, in which a highly dense silicon nitride material may be provided with a highly controllable deposition rate and with very uniform material characteristics. The silicon nitride liner is then anisotropically etched in order to provide the protective spacer 103. In view of the superior integrity of the materials 161, 162A, 162B, an increased width of the spacer 103 is considered superior, while, on the other hand, in view of overall transistor performance, a reduced width would be preferable since the spacer 103 is to be maintained throughout the entire process flow and thus contributes to the total width of any additional spacers, which may determine the lateral offset of the material 151, the lateral offset of drain and source extension regions and halo regions and the like. In the example shown, the spacer 104 is provided in the form of a silicon dioxide material so as to preserve integrity of the spacer 103 in a later manufacturing stage, when the dielectric cap layer 164 is to be removed from the gate electrode structures 160A, 160B. Moreover, the spacer 105S may define the final lateral offset of the material 151 and may provide superior chemical stability in view of wet chemical etch recipes, which are typically to be applied for removing contaminants and the like, which, however, may remove silicon dioxide material. For this purpose, the spacer layer 105 is deposited as a silicon nitride material and is then selectively etched above the active region 102A in order to obtain the spacer element 105S, while the layer 105 is preserved above the active region 102B so as to act as a growth mask during the further processing of the device 100. Thereafter, an etch process is applied so as to form cavities in the active region 102A which are refilled with the material 151 based on a selective epitaxial growth technique. During this process, the semiconductor material 163 of the gate electrode structure 160A is covered by the dielectric cap material 164 and the spacers 103, 104, 105S, while the active region 102B and the gate electrode structure 160B are protected by the spacer layer 105. Thereafter, silicon nitride materials are removed on the basis of hot phosphoric acid. Consequently, the spacer layer 105, the spacer element 105S and the dielectric cap layers 164 are removed, while the offset spacer 104 may preserve integrity of the protective spacer 103. Next, the spacer 104 may be removed on the basis of hydrofluoric acid.

FIG. 1b schematically illustrates the semiconductor device 100 after the above-described process sequence. As illustrated, the semiconductor material 163 of the gate electrode structures 160A, 160B is exposed, while sidewalls of the gate electrode structures are still covered by the protective spacer 103.

FIG. 1c schematically illustrates the semiconductor device 100 in a further advanced manufacturing stage. As illustrated, a spacer structure 153, for instance in the form of a silicon nitride material, possibly in combination with an oxide liner (not shown), is formed on the protective spacer 103 in order to provide superior confinement of the sensitive materials 161, 162A, 162B, thereby also defining the lateral entry point for implantation species that may be incorporated during corresponding implantation sequences 106A, 106B. As also previously explained with reference to the protective spacer 103, the spacer structure 153 may also have a significant influence on the integrity of the sensitive gate electrode structures 160A, 160B, which may directly translate into corresponding production yield values. That is, an increased thickness of the spacer 153 may provide superior production yield, while at the same time the increased offset from the channel region 152 may result in a significant deterioration of transistor performance.

As previously discussed, during the implantation sequence 106A, the drain and source dopant species for forming extension regions 154 is introduced wherein the lateral offset of the extension regions 154 is determined by the spacer element 153. Furthermore, corresponding counter-doped regions 155, also referred to as halo regions, are formed during the implantation sequence 106A based on implantation energies so as to appropriately "embed" the drain and source extension regions 154 in the counter-doped regions 155. Similarly, the implantation sequence 106B may result in corresponding extension regions 154 and halo regions 155, wherein well-established masking regimes are to be applied which may involve a plurality of resist strip processes and cleaning processes, during which a superior encapsulation of the sensitive gate electrode structures 160A, 160B is advantageous.

FIG. 1d schematically illustrates the semiconductor device 100 in a further advanced manufacturing stage. As shown, a further spacer structure 156 is formed adjacent to the spacer 153, thereby defining a lateral offset of drain and source regions 157, which are formed for the different transistors 150A, 150B on the basis of an appropriate masking regime after providing the spacers 156 on the basis of well-established process techniques. Thereafter, an anneal sequence 107 is performed so as to activate the dopants in the extension regions 154 and the drain and source regions 157, thereby also re-crystallizing implantation-induced damage. Furthermore, during the anneal sequence 107, a desired overlap of the extension regions 154 with the gate electrode structures 160A, 160B is to be generated in order to obtain a desired Miller capacitance, as discussed above. When providing a superior encapsulation for the gate electrode structures 160A, 160B, for instance in view of increasing production yield, however, the extension regions 154 may not be appropriately "driven" into the channel regions 152. For this purpose, typically, the implantation dose of the implantation sequences 106A, 106B of FIG. 2c is appropriately increased to provide a higher dopant concentration and thus an increased overlap of the extension regions 154. However, the implantation dose may not be arbitrarily increased due to throughput-related issues. That is, for given implantation resources in the production facility a further increase in implantation dose may result in a significantly reduced overall throughput. In P-channel transistors, such as the transistor 150A, having implemented therein the threshold adjusting semiconductor material 152A, the situation may become even more complex, as discussed above, since the diffusivity of the P-type dopant species, such as boron, is significantly reduced in a silicon/germanium material, thereby further reducing the degree of overlap obtained on the basis of a given dopant concentration and process parameters of the anneal sequence 107. On the other hand, increasing anneal temperatures may be less than desirable since the dopant species of the drain and source regions 157 may increasingly diffuse into the well region, thereby reducing the distance between the drain and source regions. Furthermore, upon using increased anneal temperatures, dopant species may increasingly diffuse into the channel region and may result in an increased depth of the junction profile, which may in turn translate into higher leakage currents and increased strain-induced barrier lowering. Furthermore, the increased dopant concentration near the channel region may result in a higher probability of punch through events. Moreover, in the drain and source regions, a desired high dopant concentration is to be maintained in view of forming a metal silicide material, such as a nickel silicide, which forms a Schottky barrier with the semiconductor material, wherein the barrier may be significantly lowered upon providing a high dopant concentration. Similarly, the semiconductor material in the gate electrode structure requires a high dopant concentration in order to also lower the Schottky barrier therein.

Consequently, as indicated by experiments, a superior encapsulation of the high-k metal gate electrode structures, which may result in a significant increase of production yield, may result in a corresponding loss of performance, for instance up to 12 percent for P-channel transistors and up to 8 percent in N-channel transistors have been determined due to a corresponding reduction of the Miller capacitance caused by a desirable encapsulation of the gate electrode structures.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which drain and source dopant species may be placed with reduced lateral offset from the channel region without deteriorating the overall integrity of the sensitive high-k metal gate electrode structure. To this end, at least a portion of the extension regions may be formed on the basis of a liner material, which may be used for forming the protective spacer elements, wherein, in particular at the bottom of the sensitive gate electrode structures, the non-patterned liner material may provide superior material confinement while, at the same time, a reduced lateral offset of the implanted dopant species may be achieved. Thereafter, any further spacer elements may be provided as required for achieving a superior gate confinement and thus enhance production yield. Consequently, appropriate implantation dose values may be used during the early implantation of the drain and source extension regions in combination with appropriate anneal temperatures, while nevertheless achieving the desired high Miller capacitance.

One illustrative method disclosed herein relates to forming a transistor. The method comprises forming a protective liner above an active region and a gate electrode structure formed on the active region, wherein the gate electrode structure comprises a high-k dielectric material and a work function metal species. The method further comprises forming drain and source extension regions in the active region in the presence of the protective liner. Furthermore, a protective spacer element is formed from the protective liner and a spacer structure is provided. Moreover, the method comprises forming drain and source regions in the active region in the presence of the spacer structure.

A further illustrative method disclosed herein comprises forming a protective liner above a first active region of a first transistor and above a second active region of a second transistor. The protective liner covers a first gate electrode structure formed on a portion of the first active region and covers a second gate electrode structure formed on a portion of the second active region, wherein the first and second transistors differ in their conductivity type. The method further comprises performing a first implantation process so as to incorporate a drain and source dopant species in the first active region in the presence of the protective liner. The method additionally comprises forming a protective spacer element on sidewalls of the first and second gate electrode structures from the protective liner. Moreover, the method comprises forming drain and source regions in the first and second active regions.

One illustrative semiconductor device disclosed herein comprises an active region formed above a substrate and a gate electrode structure formed on the active region. The gate electrode structure comprises a gate dielectric material including a high-k dielectric material, a metal-containing cap material formed on the gate dielectric material, an electrode material and a metal silicide formed in the electrode material. The semiconductor device further comprises a protective spacer formed on sidewalls of the gate electrode structure and a first spacer formed adjacent to the protective spacer. Moreover, a second spacer is formed adjacent to the first spacer and first drain and source extension regions are formed in the active region below the protective spacer so as to extend to a first depth. The semiconductor device additionally comprises second drain and source extension regions formed in the active region so as to connect to the first drain and source extension regions, wherein the second drain and source extension regions are formed below the second spacer and extend to a second depth that is deeper than the first depth. Furthermore, the semiconductor device comprises drain and source regions formed in the active region and connecting to the second drain and source extension regions, wherein the drain and source regions extend to a third depth that is deeper than the second depth.

BRIEF DESCRIPTION OF THE DRAWINGS

The disclosure may be understood by reference to the following description taken in conjunction with the accompanying drawings, in which like reference numerals identify like elements, and in which.

Figure 1A:
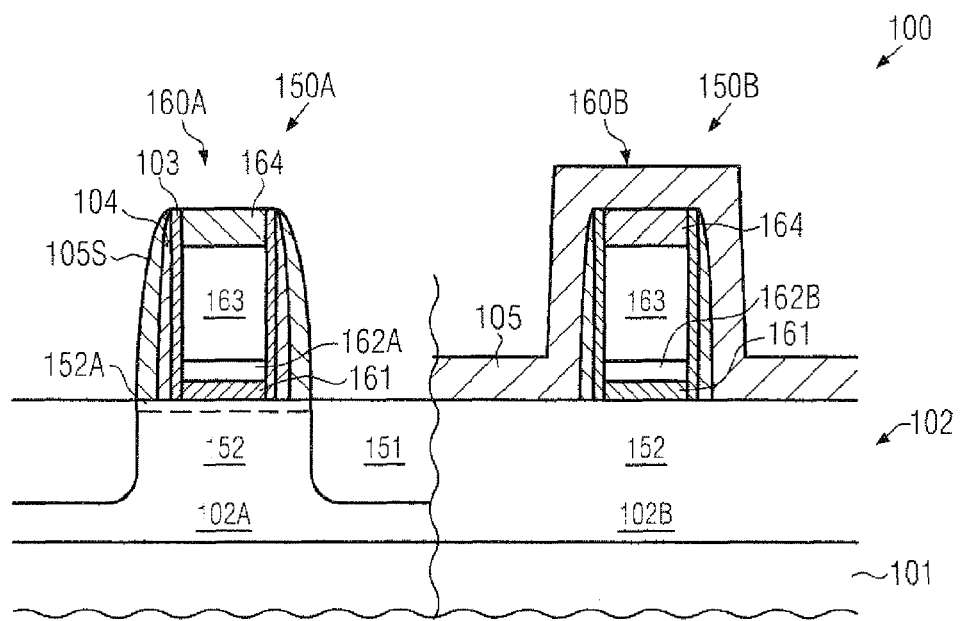
FIGS. 1a-1d schematically illustrate cross-sectional views of a semiconductor device during various manufacturing stages in forming transistors on the basis of high-k metal gate electrode structures with work function adjustment in an early manufacturing stage, according to conventional process strategies.
Figure 1B:
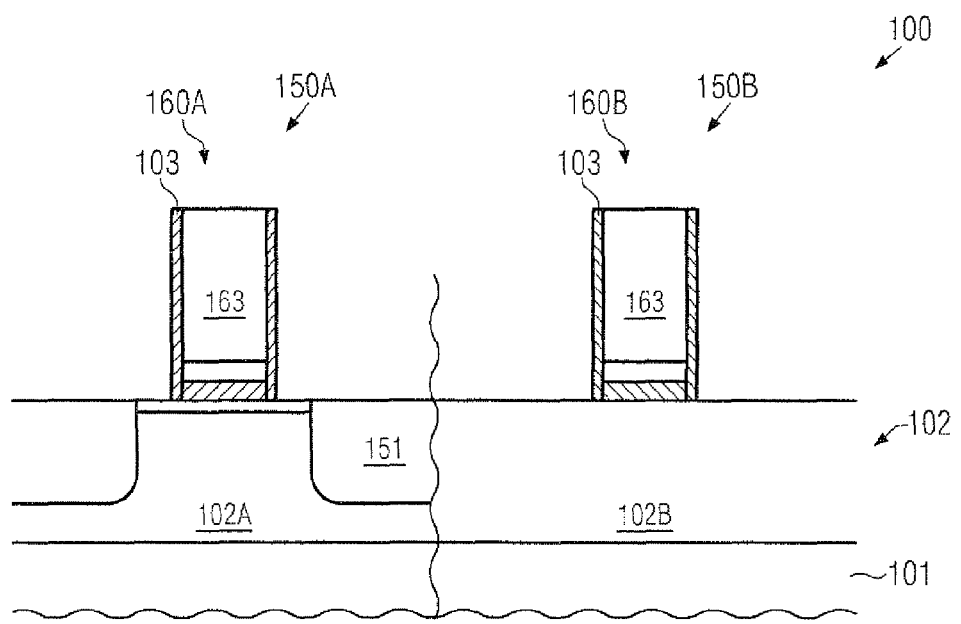
Figure 1C:
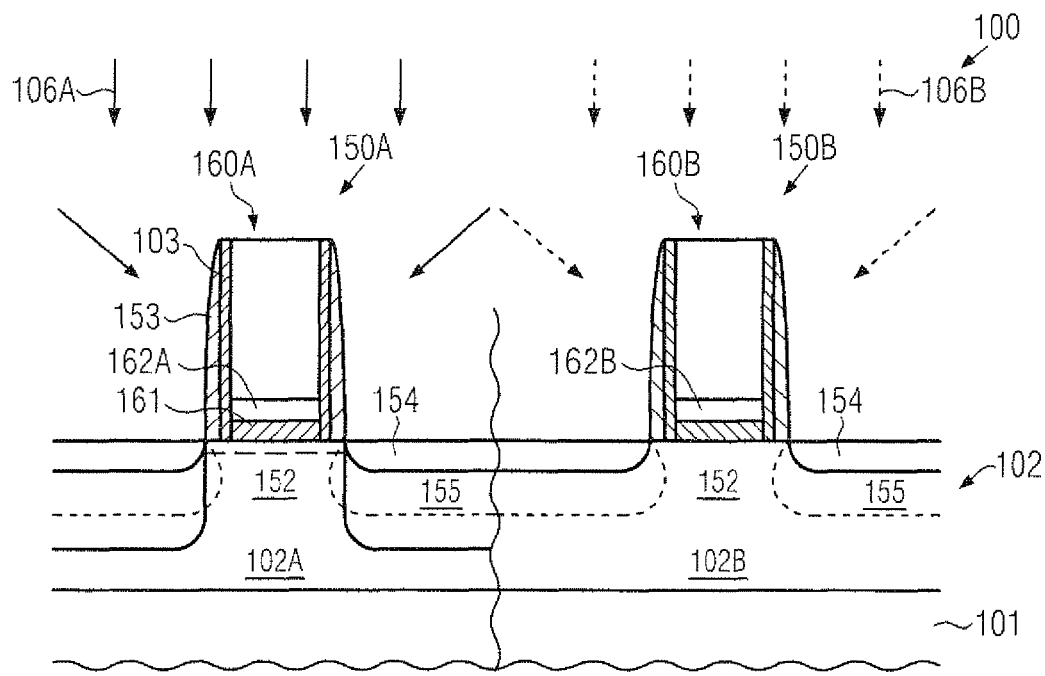
Figure 1D:
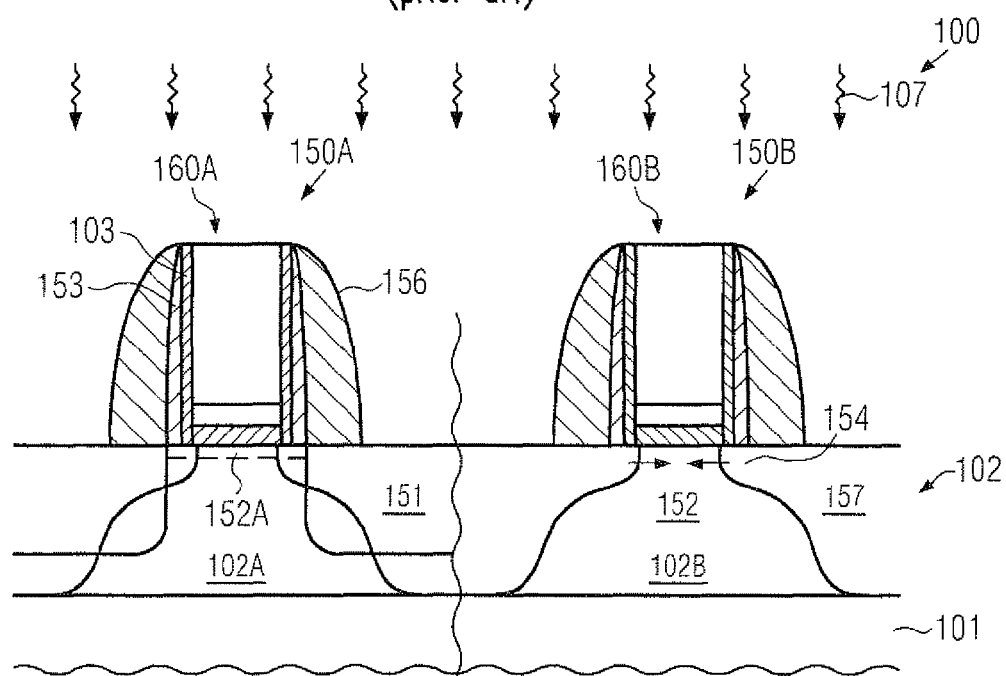

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and manufacturing techniques in which superior encapsulation of high-k metal gate electrode structures may be achieved, while at the same time a desired dopant profile may be provided for the drain and source extension regions and also for the drain and source regions. For this purpose, at least a portion of the drain and source extension dopant species may be implanted on the basis of a reduced lateral offset as determined by a spacer layer, which may then be patterned so as to obtain protective spacer elements, the width thereof may be increased during further processing, for instance by providing additional spacer elements and the like. Since the implantation process may be performed on the basis of the protective liner prior to patterning the same, critical areas of the gate electrode structure, such as the bottom of the gate electrode structure, may be reliably covered by the liner material, thereby reducing any interaction of aggressive chemicals, such as cleaning recipes to be applied for providing resist masks and removing the same and the like. Consequently, possible patterning-related non-uniformities of the gate electrode structure, in particular at the bottom thereof, may be reliably covered by the moderately thin protective liner material, wherein additional encapsulation of the gate electrode structure may be provided in the subsequent process phases, however, without affecting the resulting Miller capacitance. Consequently, the spacer regime to be used for encapsulating the gate electrode structure may be selected in view of obtaining a high production yield, while at the same time the resulting dopant profile results in a desired superior transistor performance. For example, in transistor elements requiring a specifically designed threshold adjusting semiconductor material, such as a silicon/germanium alloy, an appropriate dopant concentration may be provided in close proximity to the channel region while avoiding extremely high implantation dose values during the implantation process, wherein at the same time a desired high Miller capacitance may be obtained despite the reduced diffusivity in the silicon/germanium alloy at appropriate anneal temperatures. Consequently, by applying an early implantation process for forming at least a portion of the drain and source extension regions on the basis of a reduced lateral offset, a high degree of flexibility in adjusting the dopant profiles of various transistors, such as P-channel transistors or N-channel transistors or both, while overall transistor variability, for instance in terms of threshold variability, may be reduced due to a superior encapsulation of the sensitive gate electrode structures, while at the same time a high production yield may be accomplished.

With reference to FIGS. 2a-2f, further illustrative embodiments will now be described in more detail, wherein reference may also be made to FIGS. 1a-1d, if required.

Figure 2A:
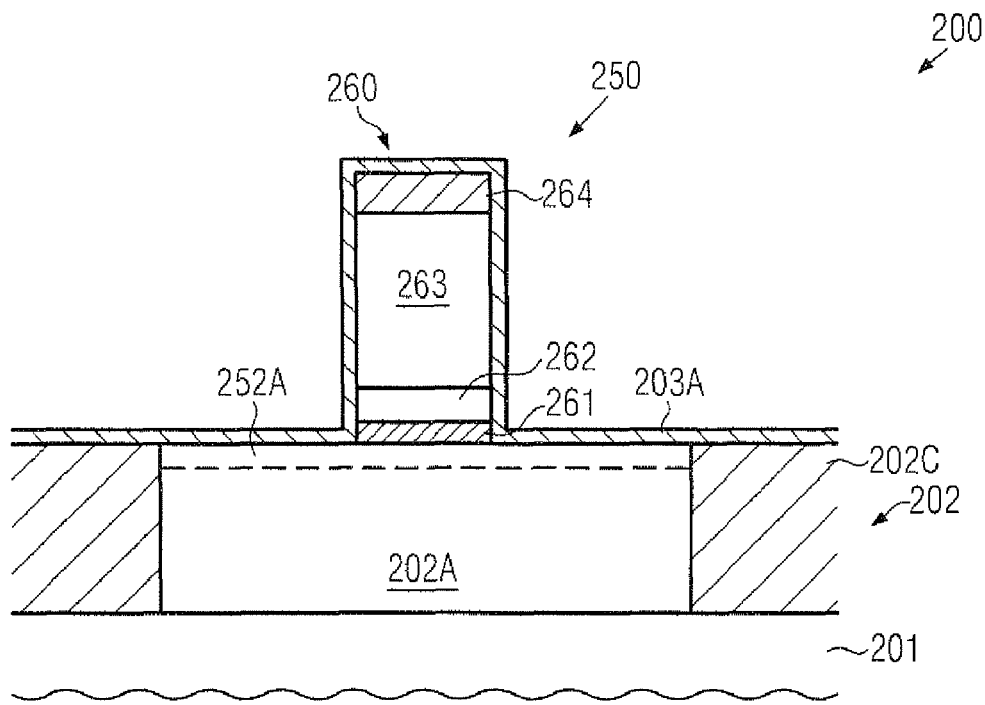
FIGS. 2a-2b schematically illustrate cross-sectional views of a semiconductor device comprising a high-k metal gate electrode structure and a protective liner through which at least a portion of drain and source extension regions may be implanted, according to illustrative embodiments.

FIG. 2a schematically illustrates a cross-sectional view of a semiconductor device 200 comprising a substrate 201 in combination with a silicon-based semiconductor layer 202. In the semiconductor layer 202, isolation structures 202C may laterally delineate semiconductor regions or active regions, as is also previously discussed with reference to the semiconductor device 100. For example, a plurality of active regions corresponding to P-channel transistors and N-channel transistors may be provided in the semiconductor layer 202, as is also discussed above with reference to the transistors 150A, 150B when referring to the semiconductor device 100 as described with reference to FIGS. 1a-1d. It should be appreciated that the substrate 201 in combination with the semiconductor layer 202 may have any appropriate configuration, as, for instance, also discussed above with reference to the device 100. For example, the device 200 may represent a bulk configuration, at least locally, or a silicon-on-insulator (SOI) configuration when a buried insulating material (not shown) is formed between the substrate 201 and the layer 202. For convenience, a single active region 202A is illustrated in FIG. 2a and may correspond to a transistor 250, which may represent a P-channel transistor or an N-channel transistor. For example, the active region 202A may comprise a threshold adjusting semiconductor material 252A, for instance in the form of a silicon/germanium mixture or alloy, when a corresponding adaptation of the band structure with respect to a gate electrode structure 260 may be required. For example, as explained above with reference to the device 100, frequently, P-channel transistors may be formed on the basis of the threshold adjusting semiconductor material 252A. In other cases, the material composition of the semiconductor region 202A may be substantially continuous in the manufacturing stage shown, for instance when representing an N-channel transistor. Moreover, the gate electrode structure 260 may comprise a gate dielectric material 261 in combination with a metal-containing cap material 262, followed by a semiconductor-based electrode material 263, which in turn may be covered by a dielectric cap material 264. As also previously explained with reference to the semiconductor device 100, the gate dielectric material 261 may comprise an appropriate material composition in order to provide increased dielectric constant. For instance, the material 261 may be composed of two or more different material layers, such as silicon dioxide, silicon oxynitride and the like, in combination with a high-k dielectric material, such as hafnium-containing dielectric materials, zirconium-containing dielectric materials and the like. For example, a total thickness of the gate dielectric material 261 may be in the range of one to several nanometers, while nevertheless providing an increased capacitive coupling compared to silicon dioxide-based dielectric material having the same thickness. Furthermore, the metal-containing material 262 may comprise an appropriate work function metal species, such as aluminum, lanthanum and the like, depending on the conductivity type of the transistor 250. The work function metal species may be incorporated in a "carrier material," such as a titanium nitride material and the like, while, in other cases, any other appropriate metal-containing layer or material layer stack may be provided as long as a desired work function metal species is appropriately distributed within the material 262 and possibly within the material 261. It should be appreciated that, with respect to the gate dielectric material 261 and metal-containing material 262, the same criteria may apply as previously discussed with reference to the materials 161, 162A and 162b. That is, the work function adjusting species may also be diffused into the gate dielectric material, or at least a portion thereof, and then the diffusion layer(s) may be removed, followed by the deposition of the metal-containing layer 262. Similarly, the electrode material 263, for instance in the form of amorphous silicon, polycrystalline silicon, silicon/germanium and the like, may be provided so as to comply with the overall device requirements. Also, the dielectric cap material 264, for instance in the form of a silicon nitride material, possibly in combination with silicon dioxide materials and the like, may have any appropriate configuration as required for patterning the gate electrode structure 260 and for performing subsequent processes. As discussed above, the gate electrode structure 260 may have a length of approximately 40 nm and less if sophisticated semiconductor devices are considered. Furthermore, in the manufacturing stage shown, a protective liner 203A, such as a silicon nitride material, is formed so as to cover the active region 202A, i.e., the portion not covered by the gate electrode structure 260, and so as to cover exposed surface areas of the gate electrode structure 260. The protective liner 203A may have a superior uniformity with respect to layer thickness and material composition, which may be accomplished on the basis of well-established highly conformal thermally activated and/or plasma assisted deposition techniques. For example, the liner 203A may be provided with a thickness of approximately 1-10 nm, depending on the desired lateral offset of drain and source extension regions still to be formed in the active region 202A.

The semiconductor device 200 may be formed on the basis of well-established process strategies, as are also described above with reference to the device 100. For example, the isolation structure 202C may be formed on the basis of sophisticated lithography, etch, deposition and planarization techniques, followed by the incorporation of an appropriate well dopant species into the active region 202A. Moreover, prior to or after providing the isolation structures 202C, the threshold adjusting semiconductor material 252A, if required, may be formed on the basis of epitaxial growth techniques. For example, the material 252A may be selectively formed in some of the active regions, such as in P-channel transistors, as discussed above with reference to the device 100, which may be accomplished by forming the material 252A in any active region and selectively removing the same. In other illustrative embodiments, active regions of, for instance, N-channel transistors may be covered by a dielectric mask, such as an oxide mask, while performing a selective epitaxial growth process for growing the material 252A in exposed semiconductor areas, such as the semiconductor region 202A. Thereafter, a process sequence may be performed to obtain the gate electrode structure 260 so as to include an appropriate work function metal species for each type of transistor, as is also discussed above with reference to the device 100. Thereafter, the protective liner 203A may be deposited on the basis of deposition techniques as specified above with a desired thickness in order to adjust a lateral offset of extension regions still to be formed. Consequently, the liner 203A may reliably cover any patterning-related non-uniformities of the gate electrode structure 260, for instance, in particular, at a bottom thereof, which may be caused by the presence of the different materials 261, 262 and 263.

Figure 2B:
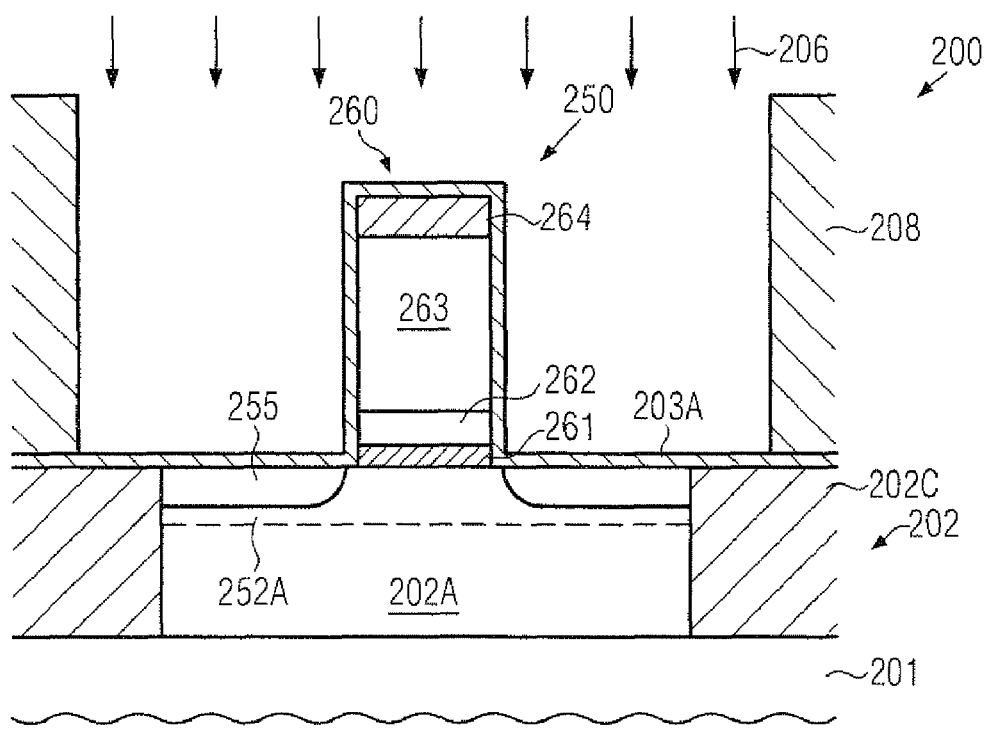

FIG. 2b schematically illustrates the semiconductor device 200 in a further advanced manufacturing stage. As illustrated, an implantation mask 208, such as a resist mask, may be provided so as to expose the active region 202A while covering other active regions in which the incorporation of a dopant species for forming drain and source extension regions 255 is to be avoided. For this purpose, any appropriate masking regimes may be applied. In order to introduce an appropriate drain and source dopant species, an implantation process 206 may be performed by using appropriate process parameters, such as dose and energy, in order to obtain the extension regions 255 with a desired dopant profile. For example, in the case of a P-channel transistor, a P-type dopant species, such as boron, may be implanted during the process 206, while, for an N-channel transistor, an N-type dopant species may be incorporated, such as phosphorus or arsenic and the like. As previously discussed, since the liner 203A may provide a moderately reduced lateral offset, an appropriate implantation dose may be selected which may be compatible with the capabilities of available implantation tools in order to obtain an appropriate dopant concentration in the extension regions 255 in order to avoid undue diffusion in the depth direction, while nevertheless providing the desired lateral diffusion so as to achieve the required Miller capacitance. For example, if the threshold adjusting semiconductor material 252A is provided, the implantation 206 may be performed such that the drain and source extension regions 255 may be formed within the material 252A. Furthermore, it should be appreciated that, due to the high degree of uniformity in layer thickness and material composition of the protective liner 203A, any variations of the extension regions 255 caused by the layer 203A may be less compared to the "natural" variations of the implantation process 206. Consequently, the layer 203A may substantially not contribute to additional process non-uniformities.

After the implantation process 206, if desired, the mask 208 may be removed and a further implantation mask may be provided so as to cover the transistor 250 and expose other transistors in which drain and source extension regions of reduced lateral offset are considered advantageous for the device 200. It should be appreciated, however, that, depending on the overall process and device requirements, the extension regions 255 provided in an early manufacturing stage may be used in P-channel transistors, in N-channel transistors or in both transistor types. During the corresponding resist strip processes and intermediate cleaning processes, which are typically applied, the liner 203A may preserve integrity, in particular, of the sensitive materials 261, 262.

Figure 2C:
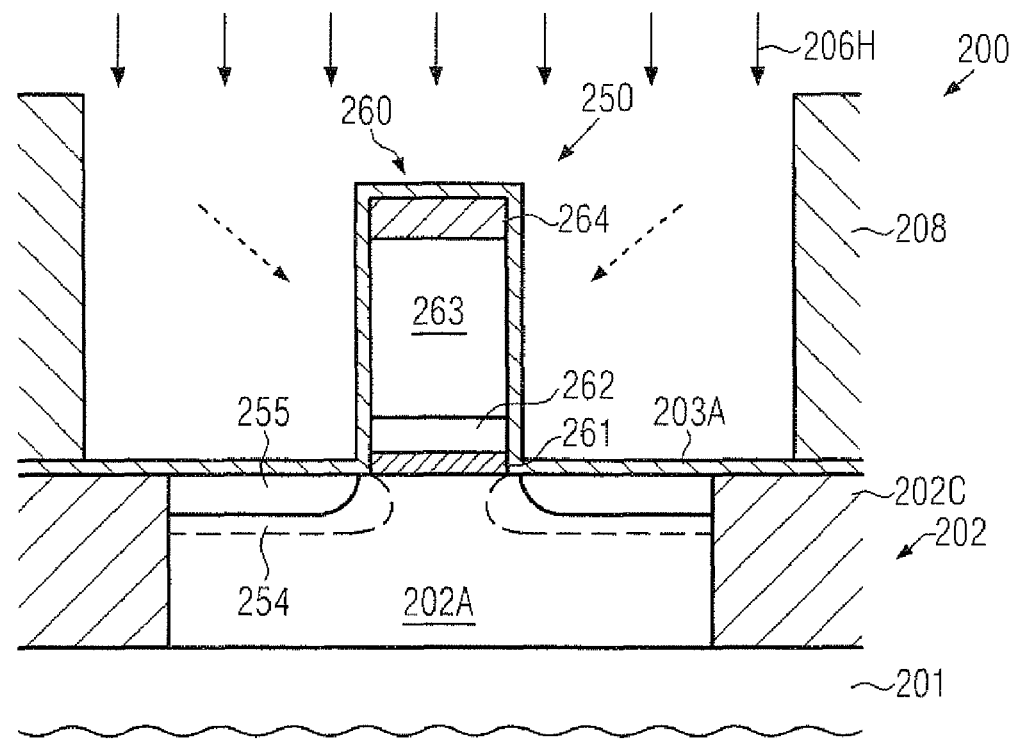
FIG. 2c schematically illustrates the semiconductor device according to still further illustrative embodiments in which halo implant species may be incorporated on the basis of the protective liner material.

FIG. 2c schematically illustrates the semiconductor device 200 according to still further illustrative embodiments in which a further implantation process 206H may be performed on the basis of the mask 208 in order to form at least a portion of counter-doped regions or halo regions 254. As also previously explained with reference to the device 100, corresponding halo regions 254 may be required to also adjust the off current of the transistor 250 and the like wherein, typically, the halo regions 254 may be formed below and adjacent to the extension regions 255. Consequently, typically, increased implantation energies may be required in view of the increased penetration depth. In this case, the gate electrode structure 260 may have an increased ion blocking capability, at least for small tilt angles of the implantation process 206H, due to the presence of the dielectric cap layer 264. Consequently, the incorporation of the counter-doping species in the electrode material 263 may be significantly reduced for a given desired implantation energy. Furthermore, the degree of threshold shift caused by the presence of the counter-doping species in the vicinity or in the material 262 may also be reduced due to the presence of the dielectric cap layer 264. In some illustrative embodiments, the halo implantation process 206H may be performed without a tilt angle or with small tilt angles to take advantage of the ion blocking capability of the material 264, wherein the blocking effect of the liner 203A at the sidewalls of the gate electrode structure 260 may be reduced. Consequently, a corresponding tilted implantation process may be performed at a later manufacturing stage, if required, when additional spacer elements are provided at the sidewalls of the gate electrode structure 260. As previously indicated, also for the implantation process 206H, P-channel transistors and/or N-channel transistors may be processed, depending on the overall requirements.

Figure 2D:
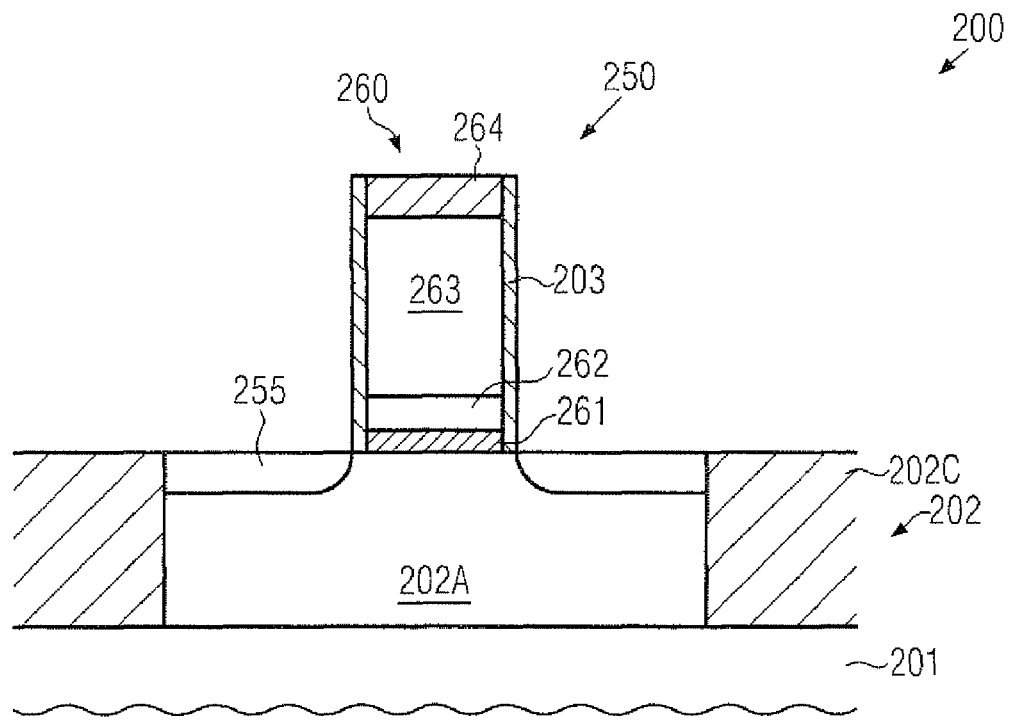
FIG. 2d schematically illustrates the semiconductor device with a protective liner formed after providing drain and source extension regions, according to illustrative embodiments.

FIG. 2d schematically illustrates the semiconductor device 200 in a further advanced manufacturing stage. As illustrated, protective spacer elements 203 are formed on sidewalls of the gate electrode structure 260, which may be accomplished by performing well-established plasma assisted etch processes for etching, for instance, silicon nitride material selectively with respect to silicon-based materials and oxide. Consequently, the transistor 250 may comprise at least the extension regions 255 having the reduced lateral offset obtained by the protective liner 203A (FIG. 2b). It should be appreciated that, in other illustrative embodiments (not shown), spacer elements may be formed by depositing a further spacer layer, such as a further silicon nitride material, which may also be patterned commonly with the protective liner 203A (FIG. 2b), thereby obtaining the spacer element 203 with an increased thickness, if considered appropriate. In other cases, the further processing may be continued by performing any other desired sidewall spacer structure, as is, for instance, also described above with reference to the semiconductor device 100.

Figure 2E:
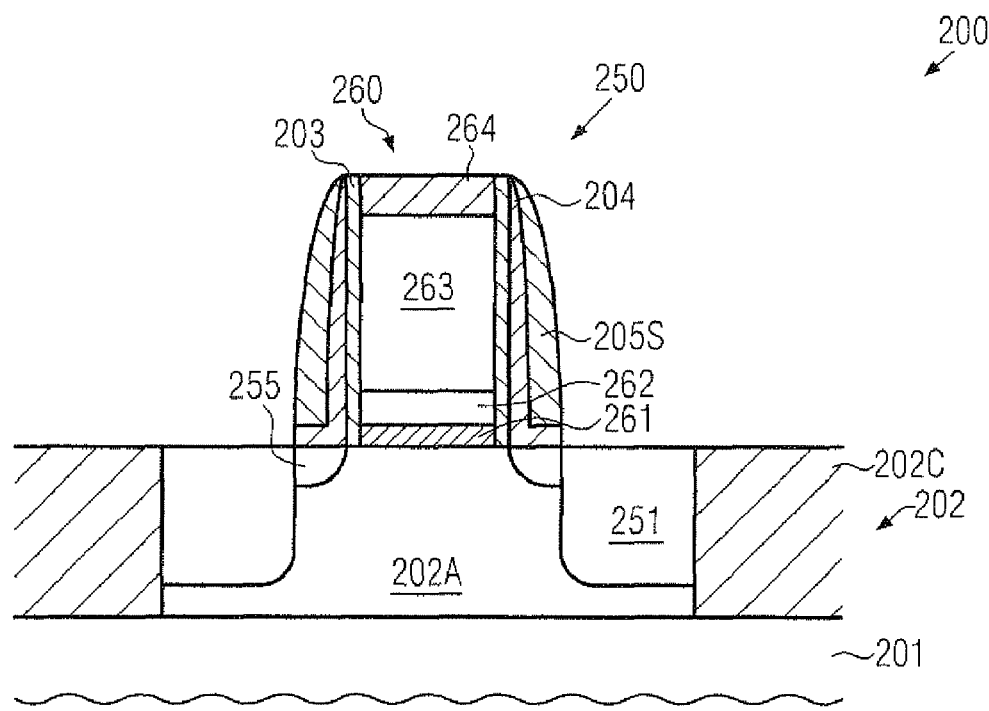
FIGS. 2e-2g schematically illustrate cross-sectional views of the semiconductor device in further advanced manufacturing stages, according to illustrative embodiments.

FIG. 2e schematically illustrates the semiconductor device 200 according to illustrative embodiments in which a strain-inducing material 251 may be incorporated in the active region 202A. For this purpose, well-established process strategies may be applied, as previously explained with reference to the device 100. For example, an appropriate spacer structure including an oxide spacer 204 in combination with a nitride spacer 205S may be formed on the protective spacer element 203, thereby reliably encapsulating the electrode material 263 and still preserving integrity of the sensitive materials 261 and 262. As described above with reference to FIGS. 1a-1d, other active regions and corresponding gate electrode structures may be protected by a spacer layer, if the provision of the material 251 is not required in these areas. Next, cavities may be formed in the active region 202A, thereby also removing a portion of the previously implanted drain and source extension regions 255. Thereafter, the material 251 may be formed on the basis of selective epitaxial growth techniques in accordance with the overall process requirements. Thereafter, the spacer 205S, the spacer 204 and the dielectric cap layer 264 may be removed on the basis of appropriate etch recipes, as previously explained. At the same time, the gate electrode material 263 of other gate electrode structures covered by a spacer layer may also be exposed.

Figure 2F:
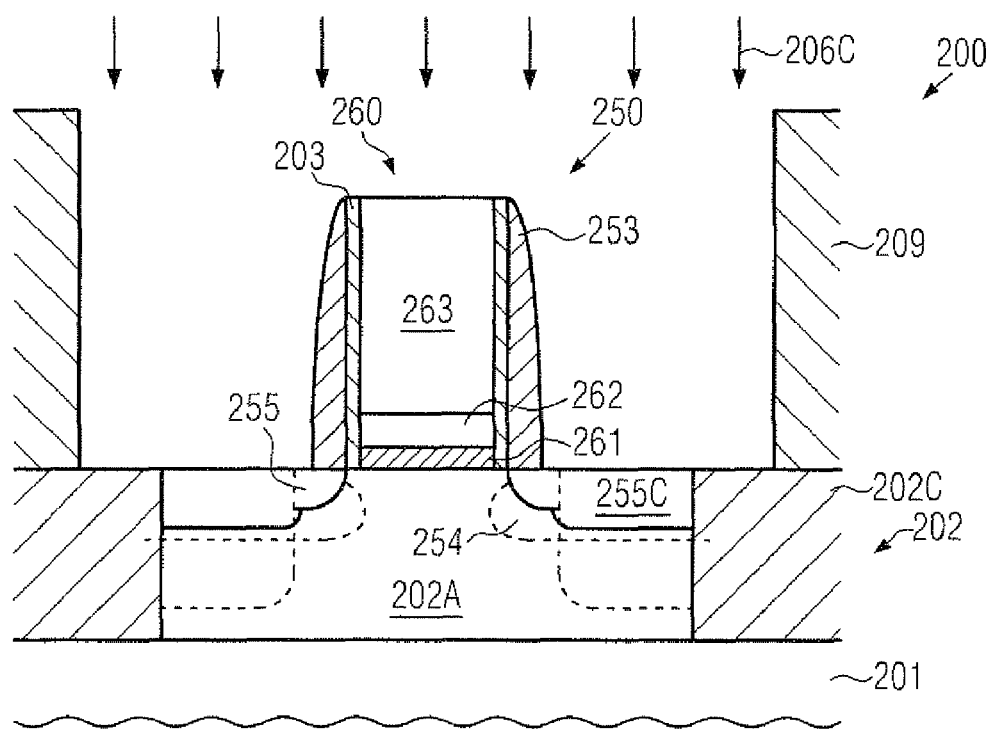

FIG. 2f schematically illustrates the semiconductor device 200 in a further advanced manufacturing stage in which the gate electrode structure 260 may have formed on sidewalls thereof a further spacer structure 253, thereby providing superior encapsulation of the gate electrode material 263 and, in particular, of the sensitive materials 261 and 262. In some illustrative embodiments, the device 200 may be exposed to a further implantation process 206C or implantation sequence for forming second extension regions 255C, wherein the spacer structure 253 may determine the lateral entry point of the corresponding dopant species. For example, if a significant portion of the previously implanted extension regions 255 have been removed due to the provision of the material 251 (FIG. 2e), the second extension regions 255C may compensate for the corresponding dopant loss. In other illustrative embodiments, the implantation process 206C may be used to provide a superior dopant profile and a higher dopant concentration, wherein the regions 255C may appropriately connect to the regions 255. For example, the regions 255C may be provided with an increased depth compared to the regions 255. It should be appreciated that, in other illustrative embodiments, the second extension regions 255C may not be necessary, for instance when the material 251 has not been formed in the active region 202A. Moreover, the implantation sequence 206C may, in addition to or alternatively to an implantation step for incorporating drain and source dopant species, also comprise an implantation step for introducing a counter doping species so as to form the halo region 254, or to complete these regions if a corresponding portion of the halo regions has already been formed as explained with reference to FIG. 2c. For example, due to the additional spacer structure 253, superior ion blocking capabilities may also be provided at the sidewalls of the gate electrode structure 260, thereby enabling implantation steps with a desired tilt angle without unduly incorporating the counter doping species in the gate electrode structure 260 and in particular at the vicinity of the sensitive materials 261 and 262. It should be appreciated that the implantation sequence 206C may be performed on the basis of an implantation mask 209 in order to cover other active regions, such as active regions of transistors of different conductivity type compared to the transistor 250, as is also previously explained.

Figure 2G:
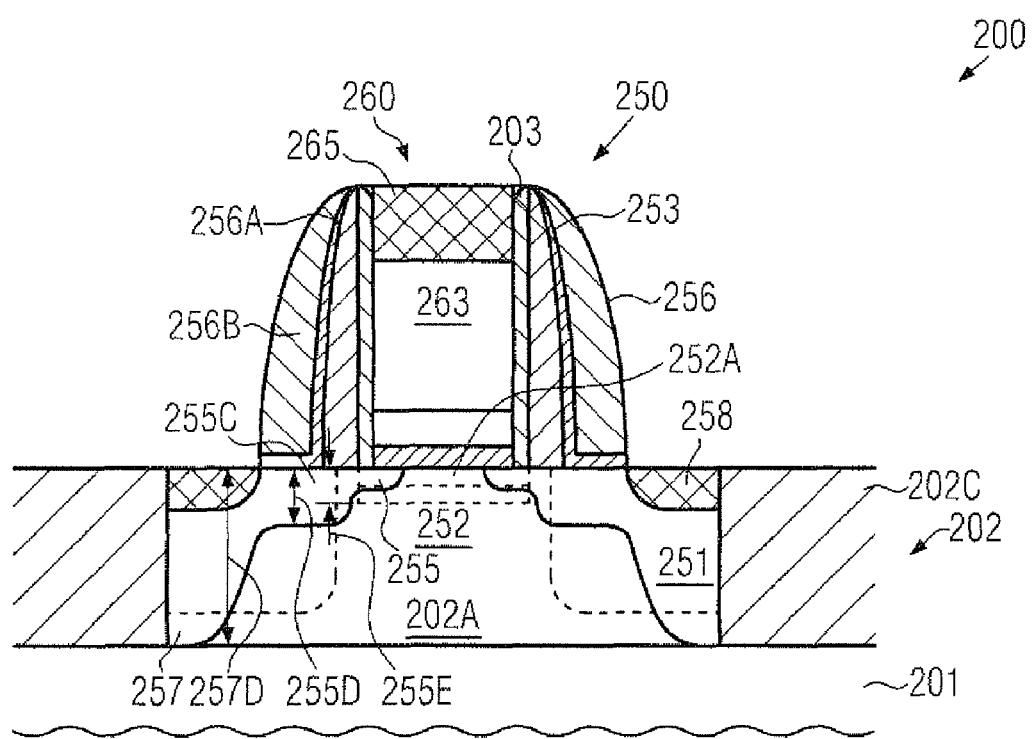

FIG. 2g schematically illustrates the semiconductor device 200 in a further advanced manufacturing stage. As illustrated, a further spacer structure 256, which may comprise an etch stop liner 256A in combination with a spacer element 256B, may be formed adjacent to the spacer structure 253. Furthermore, drain and source regions 257 may be formed in the active region 202A so as to connect to the extension regions 255 and/or to the second extension regions 255C, if provided. Moreover, metal silicide regions 258, such as nickel silicide regions, are formed in the drain and source regions 257 and similarly a metal silicide region 265 may be formed in the gate electrode structure 260, i.e., within the electrode material 263.

The semiconductor device 200 as illustrated in FIG. 2g may be formed on the basis of any appropriate process technique. That is, after forming the extension region 255C, if required, the sidewall spacer structure 256 may be formed by deposition and anisotropic etch techniques, thereby adjusting a desired lateral offset of the drain and source regions 257 during a subsequent implantation process for introducing the corresponding drain and source dopant species. Thereafter, one or more anneal processes may be performed so as to activate the dopant species and re-crystallize implantation-induced damage. Furthermore, as previously explained, a certain degree of dopant diffusion may be initiated during the one or more anneal processes, thereby driving the extension regions 255 below the gate electrode structure 260 in order to obtain the desired Miller capacitance. Due to the reduced lateral offset of the extension regions 255 as implanted (FIG. 2b), the required increase of the extension regions 255 on the basis of a moderately high dopant concentration may nevertheless result in the desired overlap and thus transistor performance. At the same time, undue diffusion into remaining portions of the active region 202A may be suppressed. In the embodiment shown in FIG. 2g, the extension regions 255 and the second extension regions 255C may thus have a final depth that differ from each other, thereby obtaining a superior connection to the channel region 252. Furthermore, the drain and source regions 257 may be provided with a depth 257D as desired, which may be deeper than the depth 255D of the second extension regions 255C, which have a depth that is greater than the depth 255E of the regions 255. Moreover, due to the provision of the second extension regions 255C, a moderately high dopant concentration may be obtained at the top of the drain and source regions 257, thereby lowering the Schottky barrier of the nickel silicide regions 258 in the drain and source regions 257, which in turn may result in a reduced overall resistance of the transistor 250. Similarly, a moderately high dopant concentration may be obtained in the electrode material 263 since at least the dopants of the second extension regions 255C and of the drain and source regions 257 have been implanted without providing a cap layer on top of the gate electrode structure 260, thereby also obtaining a desired high dopant concentration for reducing the Schottky barrier for the metal silicide region 265.

As a result, the present disclosure provides semiconductor devices and manufacturing techniques in which superior confinement of a sensitive high-k metal gate electrode structure may be achieved, while nevertheless the lateral offset of extension regions may be reduced. For this purpose, at least a portion of the extension regions may be implanted in the presence of the protective liner material prior to patterning corresponding protective spacer elements. The concept of an early implantation of extension regions may be applied to P-channel transistors and/or N-channel transistors, depending on the overall process and device requirements. For example, the various masking and cleaning processes required for, for instance, providing the early extension regions for N-channel transistors and P-channel transistors may be performed in the presence of the protective liner material, thereby maintaining integrity, in particular of the bottom area, of the sensitive gate electrode structures. Furthermore, further sophisticated process techniques, such as the implementation of a threshold adjusting semiconductor material and/or a strain-inducing semiconductor material, may be implemented, wherein the early implantation of the extension regions, or at least a portion thereof, may also result in superior transistor performance, for instance, by compensating for a reduced diffusivity of a P-type dopant species in a silicon/germanium alloy provided in the channel region of sophisticated P-channel transistors. In some illustrative embodiments, a portion of the halo regions may also be formed in an early manufacturing stage, thereby providing superior ion blocking capabilities of the gate electrode structure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor, the method comprising:
    forming a protective liner above an active region and a gate electrode structure formed on said active region, said gate electrode structure comprising a high-k dielectric material and a work function metal species;
    forming drain and source extension regions in said active region in the presence of said protective liner;
    forming a protective spacer element from said protective liner;
    forming a spacer structure; and
    forming drain and source regions in said active region in the presence of said spacer structure.

2. The method of claim 1, further comprising forming second drain and source extension regions by using said spacer structure as an implantation mask.

3. The method of claim 2, further comprising performing an implantation process so as to introduce a counter doping species by using said spacer structure as an implantation mask.

4. The method of claim 2, further comprising forming a second spacer structure adjacent to said spacer structure and using said second spacer structure as a mask for forming said drain and source regions.

5. The method of claim 1, further comprising performing an implantation process so as to introduce a counter doping species in the presence of said protective liner.

6. The method of claim 1, further comprising forming a threshold adjusting semiconductor material on said active region prior to forming said gate electrode structure.

7. The method of claim 1, further comprising forming a strain-inducing semiconductor alloy in said active region after forming said protective spacer element.

8. The method of claim 6, wherein forming said drain and source extension regions comprises using a P-type dopant species.

9. The method of claim 1, wherein forming said drain and source extension regions comprises using an N-type dopant species.

10. The method of claim 6, wherein said threshold adjusting semiconductor material is comprised of silicon and germanium.

11. The method of claim 7, wherein said strain-inducing semiconductor material is comprised of silicon and germanium.

12. A method, comprising:
    forming a protective liner above a first active region of a first transistor and a second active region of a second transistor, said protective liner covering a first gate electrode structure formed on a portion of said first active region, said protective liner covering a second gate electrode structure formed on a portion of said second active region, said first and second transistors differing in conductivity type;
    performing a first implantation process so as to incorporate a drain and source dopant species in said first active region in the presence of said protective liner;
    forming a protective spacer element on sidewalls of said first and second gate electrode structures from said protective liner; and
    forming drain and source regions in said first and second active regions.

13. The method of claim 12, further comprising performing a second implantation process so as to incorporate a drain and source dopant species in said second active region in the presence of said protective liner.

14. The method of claim 12, wherein said first gate electrode structure is formed so as to include a first work function metal species and said second gate electrode structure is formed so as to include a second work function metal species that differs from said first work function metal species.

15. The method of claim 12, further comprising forming a first spacer structure and introducing drain and source dopant species into said first and second active regions by using said first spacer structure prior to forming said drain and source regions.

16. The method of claim 15, further comprising performing a halo implantation process by using said first spacer structure as a mask.

17. The method of claim 12, further comprising performing a halo implantation process for introducing a counter doping species into said first active region in the presence of said protective liner.

* * * * *